(12) United States Patent
Belady et al.

(10) Patent No.: US 7,832,461 B2
(45) Date of Patent: Nov. 16, 2010

(54) COOLING SYSTEMS AND METHODS

(75) Inventors: Christian L. Belady, Richardson, TX (US); Vance Murakami, Cupertino, CA (US); Robert Allen Pereira, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 354 days.

(21) Appl. No.: 11/673,410

(22) Filed: Feb. 9, 2007

(65) Prior Publication Data

US 2007/0251254 A1 Nov. 1, 2007

Related U.S. Application Data

(60) Provisional application No. 60/796,259, filed on Apr. 28, 2006.

(51) Int. Cl.
*F28F 7/00* (2006.01)

(52) U.S. Cl. ................. 165/80.4; 165/80.2

(58) Field of Classification Search ........... 165/80.2, 165/80.3, 80.4
See application file for complete search history.

(56) References Cited

U.S. PATENT DOCUMENTS

| | | | |
|---|---|---|---|
| 4,612,782 A * | 9/1986 | Urch | ............ 62/116 |
| 6,181,556 B1 | 1/2001 | Allman | |
| 6,182,742 B1 * | 2/2001 | Takahashi et al. | ........... 165/80.4 |
| 6,412,551 B1 * | 7/2002 | Tustaniwskyj et al. | ...... 165/299 |
| 6,525,934 B1 | 2/2003 | Nakanishi et al. | |
| 6,714,412 B1 * | 3/2004 | Chu et al. | ............. 165/104.33 |
| 6,771,497 B2 | 8/2004 | Chen et al. | |
| 6,779,595 B1 | 8/2004 | Chiang | |
| 6,804,115 B2 | 10/2004 | Lai | |
| 6,828,675 B2 * | 12/2004 | Memory et al. | ............. 257/714 |
| 6,903,930 B2 | 6/2005 | DiStefano et al. | |
| 6,909,608 B2 | 6/2005 | Fan | |
| 6,918,429 B2 | 7/2005 | Lin et al. | |
| 7,187,549 B2 * | 3/2007 | Teneketges et al. | ........ 165/80.4 |
| 7,428,151 B2 * | 9/2008 | Sonnabend et al. | ......... 361/699 |
| 7,436,666 B1 * | 10/2008 | Konshak | .................... 165/80.4 |
| 2003/0057546 A1 * | 3/2003 | Memory et al. | ............. 257/706 |
| 2004/0008483 A1 * | 1/2004 | Cheon | ........................ 361/699 |
| 2004/0221604 A1 * | 11/2004 | Ota et al. | .................... 361/691 |
| 2007/0297136 A1 * | 12/2007 | Konshak | .................... 361/699 |

* cited by examiner

*Primary Examiner*—Ljiljana (Lil) V Ciric

(57) ABSTRACT

An exemplary cooling method may comprise thermally coupling a network of cooling lines to each of a plurality of heat exchangers in a cooling system. The method may also comprise providing a first connection from a network of cooling lines to a first fluid source and a second connection from the network of cooling lines to an optional second fluid source. The method may also comprise delivering cooling fluid through the network of cooling lines to each of the plurality of heat exchangers whether the network of cooling lines is connected only to the first fluid source or to both the first and second fluid sources.

8 Claims, 6 Drawing Sheets

Fig. 5

COOLING SYSTEMS AND METHODS

PRIORITY CLAIM

This application claims priority to co-owned U.S. Provisional Patent Application No. 60/796,259 for "Flexible Redundant Cooling For Computer Systems" of Belady, et al., filed Apr. 28, 2006, hereby incorporated by reference in its entirety as though fully set forth herein.

BACKGROUND

Electronic data centers including multiple computer systems (e.g., rack-mounted servers) and other electronic devices are becoming more densely packed to provide more computing power while at the same time consuming less physical space. Accordingly, heat dissipation continues to be a concern. If not properly dissipated, heat generated during operation can shorten the life span of various components and/or generally result in poor performance.

Various thermal management systems are available for computer systems and other electronic devices, and typically include a heat sink and/or a cooling fan. The heat sink is positioned adjacent the electronic components generating the most heat (e.g., the processor) to absorb heat. A cooling fan may be positioned to blow air across the heat sink and out an opening formed through the computer housing to dissipate heat into the surrounding environment. The use of water-cooled systems is also being explored. However, if the heat sink, cooling fan, and/or water supply fails or is otherwise taken offline (e.g., for maintenance purposes), one or more of the computer systems and/or other electronic devices may need to be taken offline as well to prevent overheating until the cooling system can be returned to an operational state. Any such shutdown, even a partial shutdown, can have a far reaching negative impact and therefore is considered undesirable.

DETAILED DESCRIPTION

Briefly, cooling systems and methods may be implemented to dissipate heat during operation of various computing and electronic devices, such as in the rack-mount environment commonly used by electronic data centers. In an exemplary embodiment, the cooling systems and methods include redundant fluid sources for cooling operations. Optionally, the cooling system may be configured for use with either single or multiple fluid sources. Where multiple fluid sources are used, if one of the fluid sources fails, is taken offline, or is otherwise unavailable, an alternate fluid source may continue to provide sufficient cooling to prevent a partial or even complete shut down of the computing and/or other electronic devices.

Figure 1A:
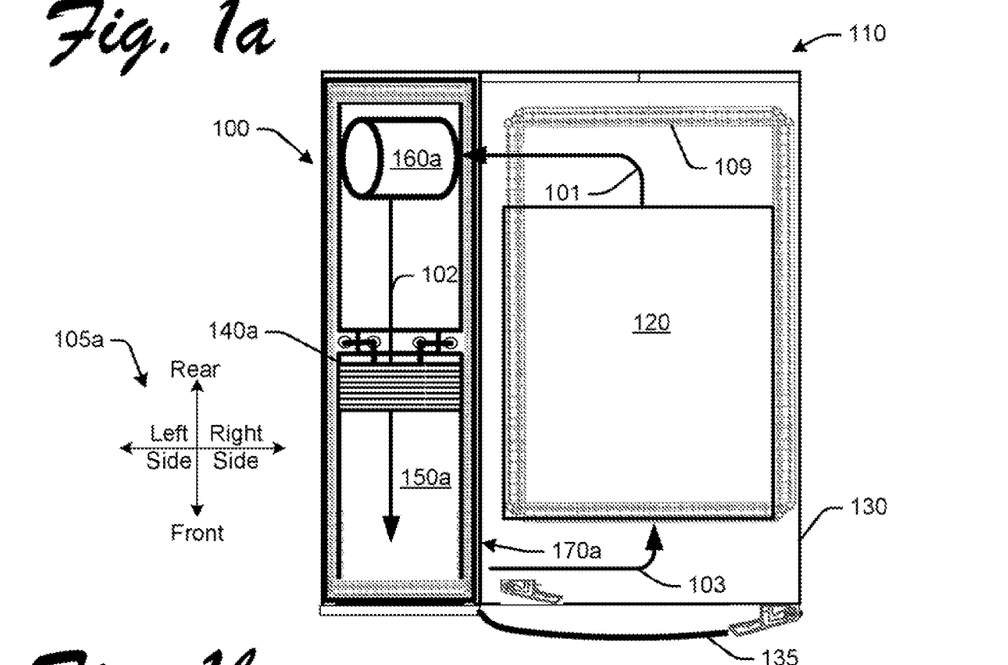
FIGS. 1a and 1b are top and side views, respectively, of an exemplary cooling system as it may be implemented in a rack-mounted environment for server computers.
Figure 1B:
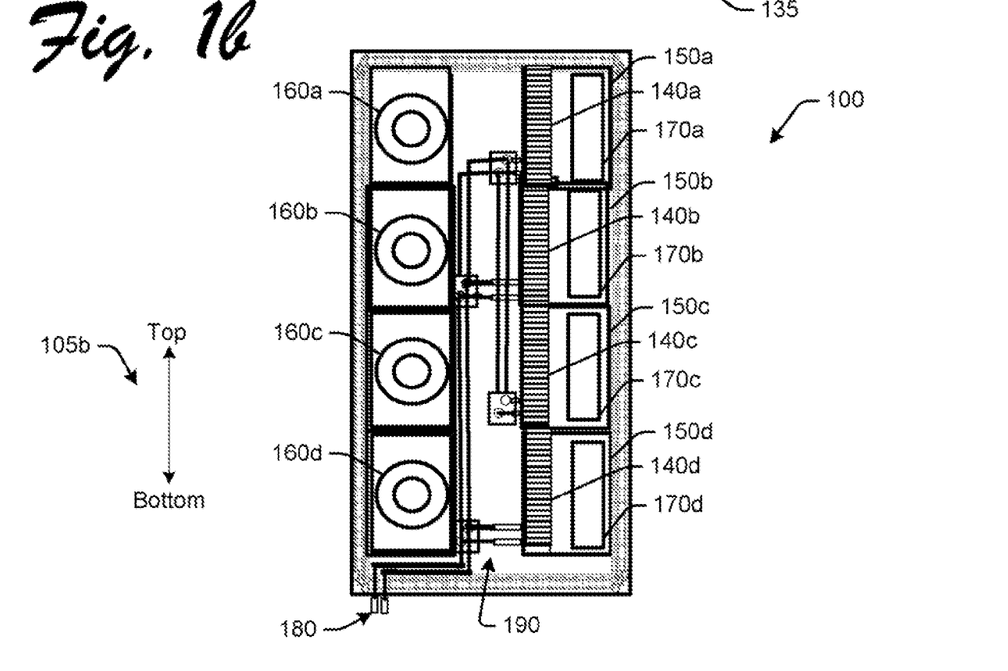

FIGS. 1a and 1b are top and left-side views, respectively, of an exemplary cooling system 100 as it may be implemented in a rack-mount environment for server computers. Directional notations 105a and 105b are shown in FIGS. 1a and 1b, respectively, to help orient the reader.

Before continuing, it is noted that the rack-mount environment in FIGS. 1a and 1b is shown only for purposes of illustration. The systems and methods described herein are not limited to use with any particular physical environment. Nor are the systems and methods limited to use with any particular type of computers or other electronic device.

In an exemplary embodiment, a rack-mount 110 may be implemented to arrange a plurality of computer systems (e.g., server computer 120 mounted to physical structure or rack 109) and/or other electronic devices such as storage, communications, and/or data processing devices (not shown). The rack-mount 110 may include an outer enclosure 130 with access door 135. The server computers are typically arranged within the enclosure 130 in a stacked relation relative to one another. Accordingly, only one server computer 120 is visible from the top view shown in FIG. 1a. Of course, a wide variety of other types of rack-mounts are also commercially available. For example, larger rack-mounts enable the server computers to be arranged in a stacked relation and a side-by-side relation relative to one another.

Each server computer 120 may include one or more processing units or processors, data storage, and/or memory. Each server computer 120 may also be operatively associated with other electronic components, such as, communication and networking devices (routers, switches, hubs), and a wide variety of input/output (I/O) devices. These other electronic components may also be arranged in the rack-mount 110.

During operation, the server computers and other electronic components may generate heat. Accordingly, a cooling system 100 may be implemented to absorb and remove heat from the rack-mount 110. In an exemplary embodiment, the cooling system 100 includes one or more heat exchangers 140a-d located near or adjacent the components generating the heat. The heat exchangers 140a-d function to absorb heat generated by the various heat-generating components.

In an exemplary embodiment, the heat exchangers 140a-d are made of a thermally conductive material (e.g., metal or metal alloys, composites, ceramic, plastics, etc.) for quickly and efficiently absorbing heat from the surroundings and releasing it to a second medium (e.g., a fluid medium such as water) flowing through the heat exchangers 140a-d. It is noted that there exist many different types of heat exchangers, and the systems and methods descried herein are not limited to any particular type of heat exchangers 140a-d. Optionally, the cooling system 100 may also include one or more cooling fans 160a-d arranged to move or circulate air in a closed loop between the server computer 120 and heat exchangers 140a-d through ducting 150a-d and out vent 170a-d in the direction generally illustrated by arrows 101-103.

It is noted that although four heat exchangers 140a-d and cooling fans 160a-d are shown in FIG. 1b, any number may be implemented. Indeed, there need not be a one-to-one correlation of heat exchangers to cooling fans. It is also noted that the location of the components may also vary (e.g., on the side next to the server computer 120 as shown, bottom, front, rear, or top). The specific implementation may depend on any of a wide variety of different design considerations, such as, the heat being generated, the desired cooling, and the surrounding environment, to name only a few examples.

As mentioned above a cooling fluid (e.g., water) may be circulated through the heat exchangers 140a-d to remove heat. The cooling fluid may be connected to one or more fluid source 180 (e.g., a building's water supply), and provided to the heat exchangers 140a-d via a network of cooling lines 190. In an exemplary embodiment, the network of cooling lines 190 may be configured (or reconfigured) for use with either single or multiple fluid sources. Such an implementation enables a production and distribution of a single cooling system 100 which can be used in more than one environment, thereby reducing costs.

In addition, the cooling system 100 may be operated in a redundant mode if it is configured for use with multiple fluid sources. That is, if one of the fluid sources fails, is taken offline, or otherwise is unavailable, an alternate fluid source may continue to provide sufficient cooling to continue operations (e.g., of one or more server 120).

In an exemplary embodiment, power consumption may also be automatically reduced in the event that one or more of the fluid sources is unavailable. That is, operation of the heat-generating components is constrained by the ability of the cooling system 100 to dissipate heat. In some circumstances, at least some of the components (e.g., critical servers) may continue to operate at full power while power to other components (e.g., to alternate, backup systems, or those executing low priority applications that are not business critical) is reduced or even turned off to meet these constraints. In any event, the loss of a fluid source for cooling operations does not result in a complete shut down.

It is noted that any of a wide variety of configurations of the cooing system 100 may be implemented to accomplish these and other advantages. Some examples of different configurations are discussed below with reference to FIGS. 2-6.

Figure 2:
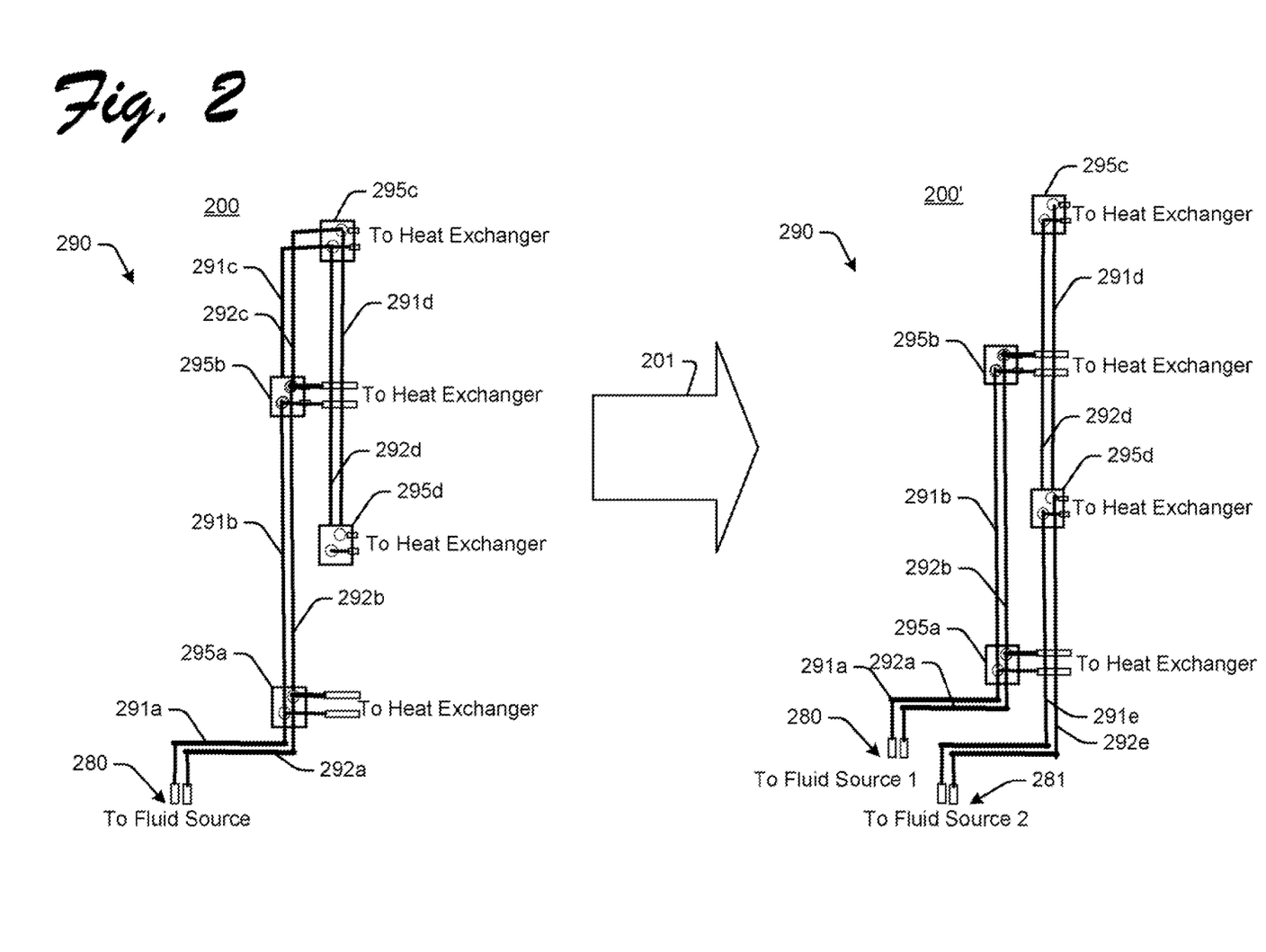
FIGS. 2-4 are simplified views of exemplary embodiments of the cooling system showing primarily the network of cooling lines.
Figure 3:
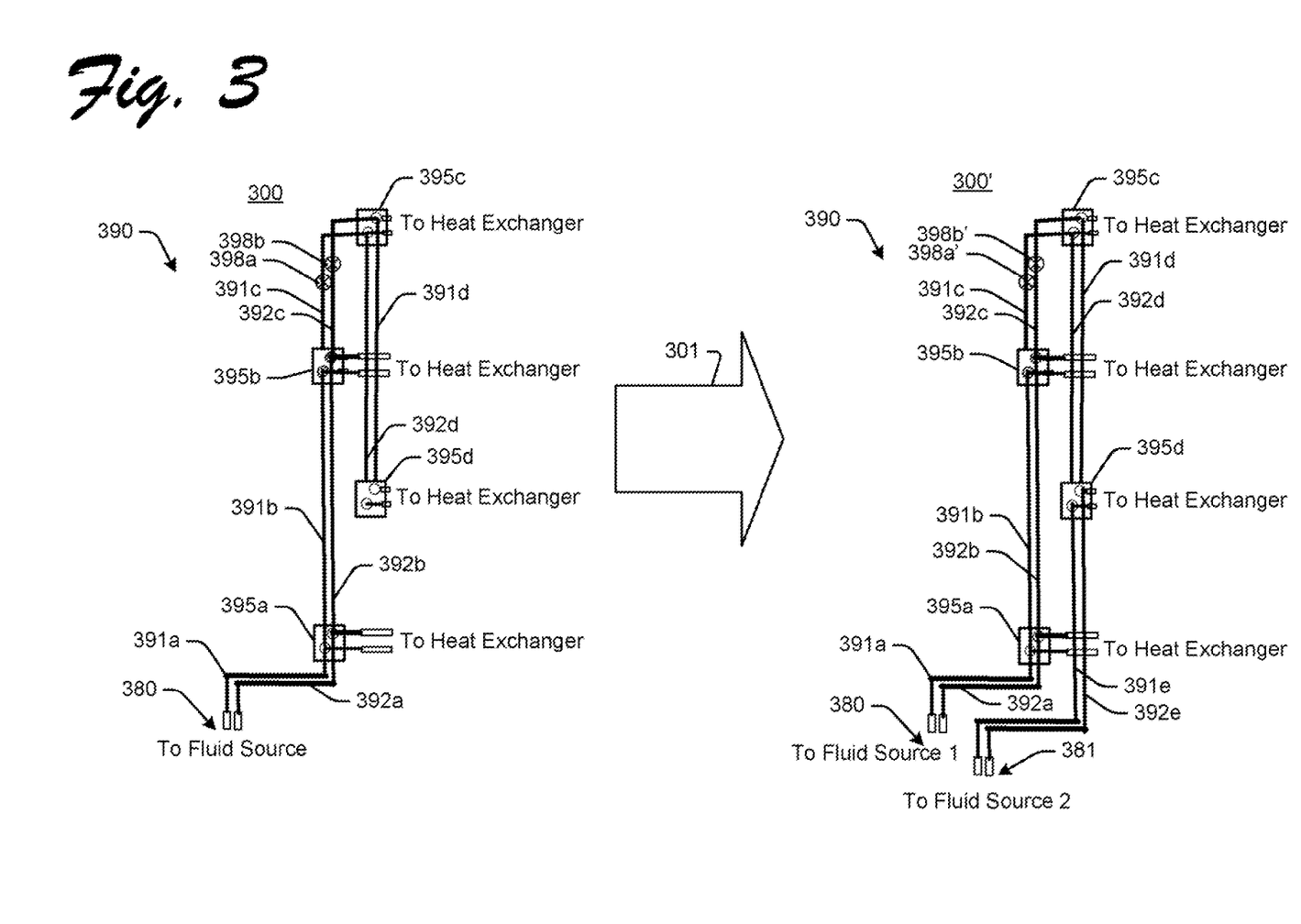
Figure 4:
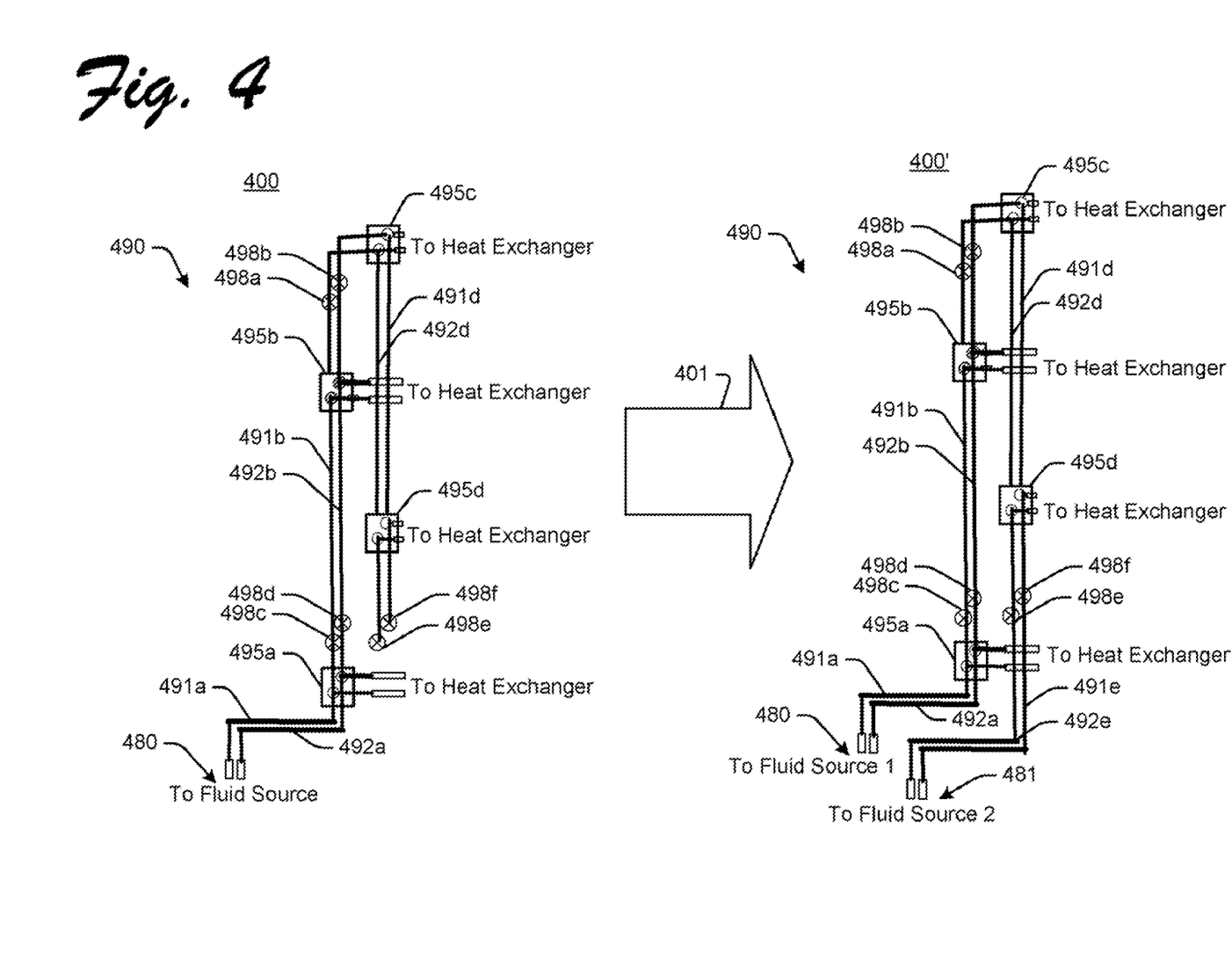

FIGS. 2-4 are simplified views of exemplary embodiments of the cooling system showing primarily the network of cooling lines (e.g., the network of cooling lines 190 shown in FIG. 1b). Other system components have been omitted or simplified in FIGS. 2-4 to better show different configurations of the network of cooling lines, FIG. 2 shows two configurations 220 and 200' of a network of cooling lines 290 that may be implemented in the same cooling system (e.g., cooling system 100 shown in FIGS. 1a and 1b). The network of cooling lines 290 may be connected to a single fluid source 280, as shown in the first configuration 200. The network of cooling lines 290 may also be connected to dual fluid sources 280 and 281, as shown in the second configuration 200'.

In the first configuration 200, the network of cooling lines 290 is connected to a first fluid source 280 such that a cooling fluid may circulate via fluid lines 291*a-d* (delivery lines) and fluid lines 292*a-d* (return lines). The fluid lines 291*a-d* and 292*a-d* are interconnected by junction boxes 295*a-d*. Junction boxes 295*a-d* also serve to connect the fluid lines to the heat exchangers (e.g., as can be seen in FIG. 1b). Other embodiments are also contemplated wherein substitutions are made for the junction boxes.

The same cooling system may be configured (as illustrated by arrow 201) in the second configuration 200' by removing the fluid lines 291*a* (delivery line) and 292*c* (return line) between junction boxes 295*b* and 295*c*, and adding fluid line 291*e* (delivery line) and fluid line 292*e* (return line) between the second fluid source 281 and junction box 295*d*.

In the second configuration 200', the cooling system is redundant. That is, if one of the fluid sources 280 or 281 is unavailable, operations may continue with each heat exchanger carrying a portion of the load. For purposes of illustration, the cooling system may be configured for operation at full power when fluid is provided by both fluid sources 280 and 281. But if one of the fluid sources 280 or 281 is unavailable, the operations need only be reduced by 50% because each heat exchanger is still able to dissipate 25% of the heat being generated where four heat exchanger are used.

Other embodiments are also contemplated, e.g., sized for 200% capacity so that when one line fails, 100% of the load is still maintained.

FIG. 3 shows two configurations 300 and 300' of a network of cooling lines 390 that may be implemented in the same cooling system (e.g., cooling system 100 shown in FIGS. 1a and 1b). The network of cooling lines 390 may be connected to a single fluid source 380, as shown in the first configuration 300. The network of cooling lines 390 may also be connected to dual fluid sources 380 and 381, as shown in the second configuration 300'.

In the first configuration 300, the network of cooling lines 390 is connected to a first fluid source 380 such that a cooling fluid may circulate via fluid lines 391*a-d* (delivery lines) and fluid lines 392*a-d* (return lines). The fluid lines 391*a-d* and 392*a-d* are interconnected by junction boxes 395*a-d*. Junction boxes 395*a-d* also serve to connect the fluid lines to the heat exchangers (e.g., as can be seen in FIG. 1b).

In addition, control valves 398*a* and 398*b* may be provided on fluid lines 391*c* and 392*c*, respectively. These may be open when the network of cooling lines 390 is connected to only the first fluid source 380. The same cooling system may be configured (as illustrated by arrow 301) in the second configuration 300' by closing these valves (the closed valves are designated 398*a'* and 398*b'*), and adding fluid line 391*e* (delivery line) and fluid line 392*e* (return line) between the second fluid source 281 and junction box 295*d*. Accordingly, the fluid lines 391*c* (delivery line) and 392*c* (return line) do not need to be removed to configure the network of cooling lines 390 in the second configuration 300'. Again, the cooling system is redundant in the second configuration 330', and there is only need for a single part number where a valve is used to set the configuration during installation at the customer site.

FIG. 4 shows two configurations 400 and 400' of a network of cooling lines 490 that may be implemented in the same cooling system (e.g., cooling system 100 shown in FIGS. 1a and 1b). The network of cooling lines 490 may be connected to a single fluid source 480, as shown in the first configuration 400. The network of cooling lines 490 may also be connected to dual fluid sources 480 and 481, as shown in the second configuration 400'.

In the first configuration 400, the network of cooling lines 490 is connected to a first fluid source 480 such that a cooling fluid may circulate via fluid lines 491*a-d* (delivery lines) and fluid lines 492*a-d* (return lines). The fluid lines 491*a-d* and 492*a-d* are interconnected by junction boxes 495*a-d*. Junction boxes 495*a-d* also serve to connect the fluid lines to the heat exchangers (e.g., as can be seen in FIG. 1b).

Control valves 498*a-f* may be operated to configure the network of cooling lines 490 in the first configuration 400 by opening control valves 498*a-d* and closing control valves 498*e* and 498*f*. Control valves 498*c-d* and 498*e-f* may be opened and control valves 498*a-b* closed to configure the cooling system in a second configuration 400' for connection to dual fluid source 480 and 481. Again, the cooling system is redundant in the second configuration 400'.

Also when the network of cooling lines 490 is in the second configuration 400', the control valves may be operated to reconfigure the network of cooling lines 490 for a single fluid source in the event one of the fluid sources 480 or 481 becomes unavailable during operation. In addition, if fluid source 481 is lost for example, the system senses this and shuts control valves 498*e-f* and dynamically opens control valves 498*a-b* so that so that no capacity is lost during operation and it is all done automatically (e.g., the system is self aware as to whether there is one source or two so that it auto configures at installation, or auto reconfigures due to a failure).

Figure 5:
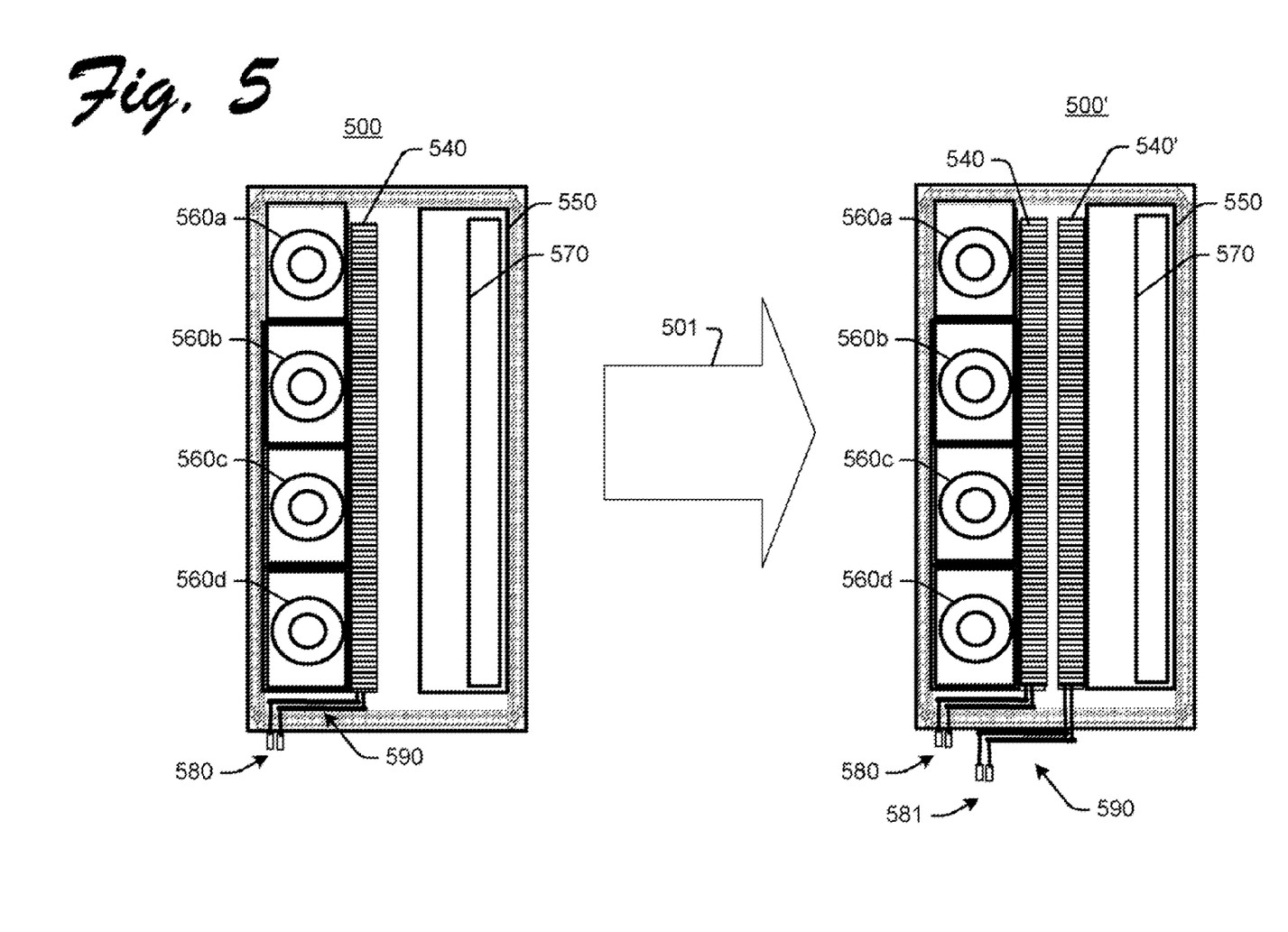
FIGS. 5 and 6 show alternative embodiments of a cooling system.
Figure 6:
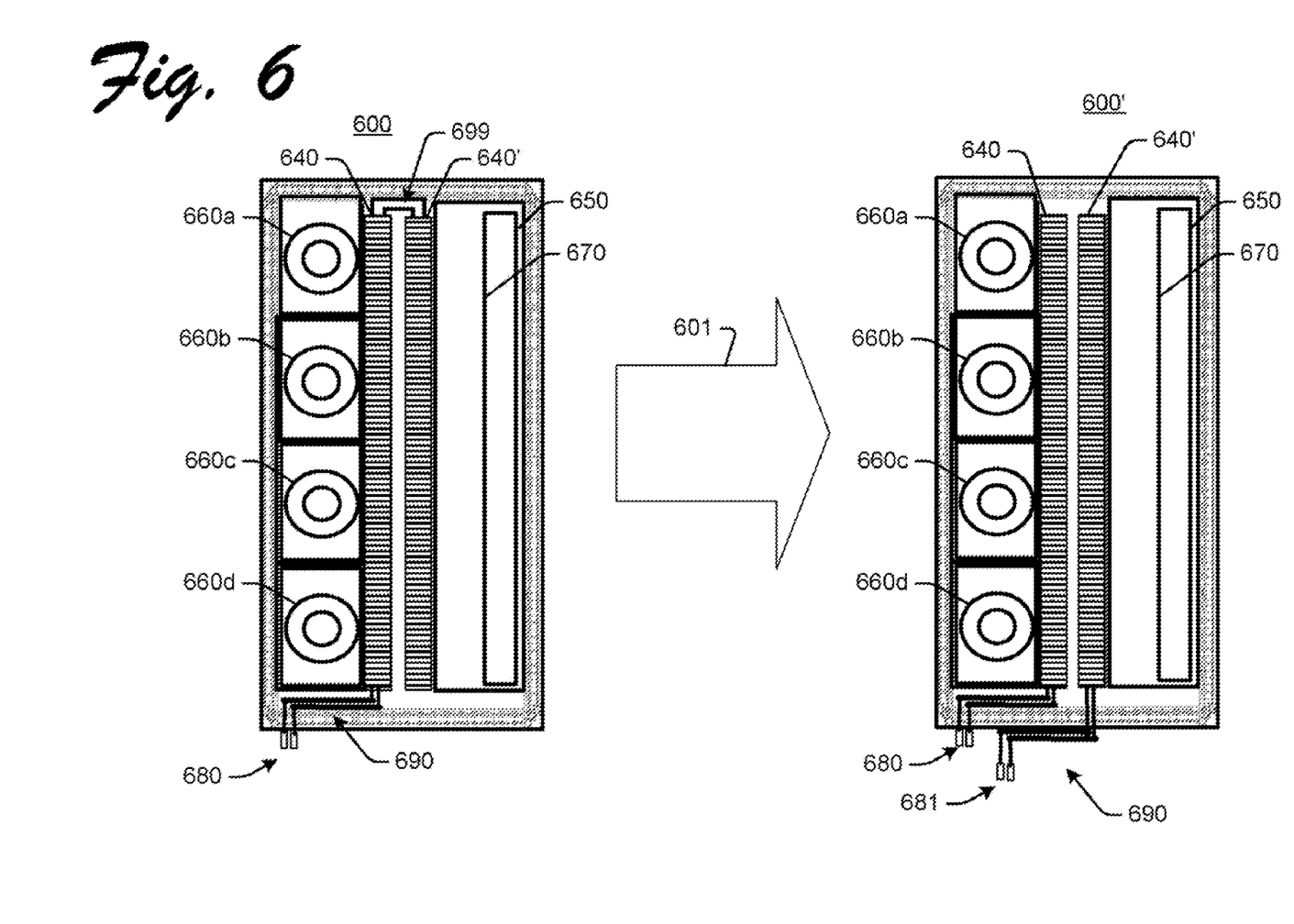

FIGS. 5 and 6 show alternative embodiments of a cooling system. It is noted that 500 and 600-series reference numbers are used in FIGS. 5 and 6 to refer to corresponding elements of the embodiment of cooling system 100 shown in FIG. 1b, and may not be described again with reference to the different embodiments of cooling systems shown in FIGS. 5 and 6.

FIG. 5 shows two configurations 500 and 500' of the same cooling system. In the first configuration, the cooling system includes a single heat exchanger 540, at least one cooling fan (four cooling fans 560a-d are shown), and ducting 550. The cooling system can be configured for in a second configuration 500' for dual fluid sources 580 and 581 by adding another heat exchanger 540'.

In an exemplary embodiment, the heat exchangers 540 and 540' are configured in series with all of the cooling fans 560a-d. Such a configuration reduces the likelihood of a failure that cripples the entire system. In addition, the system is modular and may be upgraded in the field to make it redundant for customers who may change their cooling configuration to redundant sources. Furthermore, the system can be easily configured in the factory or can be configured during installation by adding heat exchanger.

FIG. 6 shows two configurations 600 and 600' of the same cooling system. Configurations 600 and 600' are similar to the configurations shown in FIG. 5. In this embodiment, however, the cooling system is provided with optional jumper lines 699 between the heat exchangers 640 and 640'. Accordingly, the same system can be configured without having to obtain a heat exchanger 640' (e.g., after purchasing the cooling system).

It is noted that control valves (e.g., as shown in FIGS. 3 and 4) may also be implemented in the embodiments shown in FIG. 6. For example, static control valves, such as those shown in FIG. 3, may be implemented to open or close depending on the configuration 600 or 600'. In addition, dynamic control valves, such as the servo controlled valves shown in FIG. 4, may be implemented on lines 699 and 690 (for 680 and 681). In this way the system may be automatically configured as a function of the conditions sensed during installation or failure.

It should be appreciate that various exemplary embodiments of the cooling system shown (and other embodiments not shown) may be manufactured and shipped for configuration as either a single or a dual fluid cooled system at the factory, and then configure at the customer site. When the cooling system is configured for dual sources, it also has redundant cooling capacity.

It is note that the exemplary embodiments discussed above are provided for purposes of illustration. Still other embodiments are also contemplated. For example, fluid line failures ay be detected automatically by the building monitoring system and/or with sensors (e.g., pressure, flow, temperature sensors) included as part of the cooling system itself, and/or control valves may be automatically opened/closed to support the building fluid supply conditions.

It is also noted that, although the systems and methods are described with reference to computer systems, in other exemplary embodiments, the cooling systems may be implemented for other electronic devices, such as, e.g., peripheral devices for computers, video and audio equipment, etc.

In addition to the specific embodiments explicitly set forth herein, other aspects and embodiments will be apparent to those skilled in the art from consideration of the specification disclosed herein. It is intended that the specification and illustrated embodiments be considered as examples only.

The invention claimed is:

1. A cooling system for computer systems and other electronics comprising:
   a plurality of heat exchangers each positioned to absorb heat during operation;
   a first fluid source and a second fluid source;
   a first connection for the first fluid source and a second connection for second fluid source, wherein both the first fluid source and the second fluid source include cooling fluids; and
   a network of cooling lines thermally coupled to each of the plurality of heat exchangers and configured to be fluidly connected in three states, wherein, in a first state the network of cooling lines being coupled to the first connection, in a second state the network of cooling lines being coupled to the second connection, and in a third state the network of cooling lines being coupled to both the first connection and the second connection.

2. The cooling system of claim 1 wherein the network of cooling lines provides redundant cooling if connected to both the first fluid source and the second fluid source.

3. The cooling system of claim 1 wherein the network of cooling lines is configured to continue delivering cooling fluid to each of the plurality of heat exchangers even if one of the first fluid source or the second fluid source is unavailable.

4. The cooling system of claim 1 further comprising a plurality of junction boxes and a plurality of jumper lines for configuring the network of cooling lines for connection to at least one of the first fluid source and the second fluid source.

5. The cooling system of claim 1 further comprising at least one control valve for configuring the network of cooling lines for switching between the first fluid source and the optional second fluid source.

6. The cooling system of claim 1 wherein the network of cooling lines is thermally coupled in series to the plurality of heat exchangers.

7. The cooling system of claim 1 wherein the network of cooling lines is thermally coupled in parallel to the plurality of heat exchangers.

8. The cooling system of claim 1 further comprising jumper lines for connecting/disconnecting at least two of the plurality of heat exchangers to one another based on the number of fluid sources.

* * * * *

UNITED STATES PATENT AND TRADEMARK OFFICE
CERTIFICATE OF CORRECTION

| | | |
|---|---|---|
| PATENT NO. | : 7,832,461 B2 | Page 1 of 1 |
| APPLICATION NO. | : 11/673410 | |
| DATED | : November 16, 2010 | |
| INVENTOR(S) | : Christian L. Belady et al. | |

It is certified that error appears in the above-identified patent and that said Letters Patent is hereby corrected as shown below:

In column 6, line 44, in Claim 5, after "the" delete "optional".

Signed and Sealed this
Fifteenth Day of March, 2011

David J. Kappos
*Director of the United States Patent and Trademark Office*